United States Patent [19]

Taguchi et al.

[11] 4,360,582
[45] * Nov. 23, 1982

[54] PHOTOPOLYMERIZABLE ELEMENT COMPRISING A SOLUBLE OR DISPERSIBLE ORIENTED FILM SUPPORT

[75] Inventors: Tadashi Taguchi, Kawasaki; Noboru Fujikawa, Fuji; Mitsuo Kohno, Yokohama; Katsumi Yoshitake, Yokosuka; Kunio Satake, Yokohama, all of Japan

[73] Assignee: Asahi Kasei Kogyo Kabushiki Kaisha, Osaka, Japan

[*] Notice: The portion of the term of this patent subsequent to Nov. 17, 1998, has been disclaimed.

[21] Appl. No.: 295,960

[22] Filed: Aug. 25, 1981

Related U.S. Application Data

[60] Continuation-in-part of Ser. No. 104,944, Dec. 18, 1979, Pat. No. 4,301,230, which is a division of Ser. No. 923,763, Jul. 11, 1978, Pat. No. 4,211,560.

[30] Foreign Application Priority Data

Jul. 12, 1977 [JP] Japan ................................. 52-82573
Dec. 26, 1977 [JP] Japan ................................ 52-157091

[51] Int. Cl.³ .......................... G03C 1/90; G03C 5/00; G03C 1/78; G03C 1/96

[52] U.S. Cl. ..................... 430/260; 430/263; 430/271; 430/273; 430/258
[58] Field of Search ............... 430/271, 273, 260, 263, 430/258

[56] References Cited

U.S. PATENT DOCUMENTS 2,760,863  8/1956  Plambeck ............................ 430/281
3,895,949  7/1975  Akamatsu et al. .................. 430/273
4,126,466  11/1978  Roos ..................................... 430/271
4,301,230  11/1981  Taguchi et al. ...................... 430/273

Primary Examiner—Richard L. Schilling
Attorney, Agent, or Firm—Sprung, Horn, Kramer & Woods

[57] ABSTRACT

A photopolymerizable element comprising a layer of a photopolymerizable composition and a liquid developer-soluble or -dispersible transparent oriented film support laminated onto one surface of the photopolymerizable composition layer is advantageously employed for the production of a polymeric image without stripping of the film support. The element may further comprise a strippable protective film provided on the other surface of the photopolymerizable composition layer. The element of this invention is useful especially for the production of photoresists which are advantageously used for the manufacture of printed circuit boards.

18 Claims, 10 Drawing Figures

PHOTOPOLYMERIZABLE ELEMENT COMPRISING A SOLUBLE OR DISPERSIBLE ORIENTED FILM SUPPORT

This application is a continuation-in-part of application Ser. No. 104,944 filed Dec. 18, 1979, now U.S. Pat. No. 4,301,230, on PROCESS FOR PRODUCING IMAGE AND PHOTOSENSITIVE ELEMENT THEREFOR, AND METHOD OF PRODUCING PRINTED CIRCUIT BOARD and now allowed on ORIENTED POLYSTYRENE SUPPORT FOR PHOTOPOLYMERIZABLE ELEMENT, which is a divisional application of application Ser. No. 923,763 filed July 11, 1978 on PROCESS FOR PRODUCING IMAGE AND PHOTOSENSITIVE ELEMENT THEREFOR, AND METHOD OF PRODUCING PRINTED CIRCUIT BOARD and patented July 8, 1980 under U.S. Pat. No. 4,211,560 on PROCESS FOR PRODUCING IMAGE USING LAMINATED ORIENTED COVER FILM.

This invention relates to a photosensitive element. More particularly, the invention relates to a photopolymerizable element comprising a photopolymerizable layer and a film support which is soluble or dispersible in a developer consisting essentially of a liquid capable of substantially dissolving or dispersing therein the areas of the layer other than those having a polymeric image produced by imagewise exposure and is substantially transparent to actinic rays. The element of this invention have a variety of applications, and may be employed for producing photoresists with great advantages.

Various processes and elements have been proposed for producing photoresists which are useful for the production of printed circuit boards. For example, as a first instance of the conventional processes for making photoresists, it is known to directly coat a photosensitive liquid composition onto a substrate, dry the composition, imagewise expose the layer of the composition to actinic radiation and develop the layer with a liquid developer. As a second instance of the conventional processes, it is also known to use a photosensitive element comprising a flexible support film, a flexible photosensitive layer having adherence to a substrate and laminated onto the flexible support film and a protective film covering the other surface of the photosensitive layer to prevent blocking at the winding step and adhesion of dusts during handling. In the second instance, the production of photoresists are done by the steps of stripping the protective film, applying the photosensitive layer of the element to the substrate, exposing the photosensitive layer, imagewise, to actinic radiation, stripping the support film either before or after imagewise exposure and developing the layer with a liquid developer (see, for example, U.S. Pat. No. 3,469,982). In the former case, the user purchases the photosensitive liquid composition as such and coat it onto the substrate. Accordingly, the user is required to have the skill in the technique of uniformly coating the liquid composition onto the substrate. Furthermore, the resulting coated substrate must be cut, leading to increased loss of the coated substrate accompanying the cutting operation. Moreover, where the substrate is made of a metal, the metallic surface may be degenerated by the photopolymerizable layer, leading to short storage life of the resulting coated substrate. By contrast, in the latter case, there is such advantages that the skill required for the former case is not needed because the provision of the photosensitive layer on the substrate is easily effected only by the steps of stripping the protective film and subsequently applying the photosensitive layer onto the substrate, and that the photosensitive element is flexible and, hence, easy to handle because it can be formed into a roll, thus enabling the photosensitive element to be conveniently transported to the factory of the user who can easily practice a process of producing an image using the photosensitive element after cutting the element to the size of the substrate. However, in the later case also, some difficulties are still encountered. Illustratively stated, in the photoresist element employed in the latter case, the support film for bearing the photosensitive layer must have flexibility. In addition, it is indispensable that the adhesion between the substrate and the photosensitive layer should be larger than the adhesion between the film support and the photosensitive layer.

When the photoresist element to be employed in the above-mentioned second instance of the conventional processes is employed for the production of a printed circuit board, the protective film is stripped and the photosensitive layer is then applied to a substrate for producing thereon a permanent image, such as a copper-clad epoxy resin plate. If the film support is opaque, the film support is then stripped and the photosensitive layer is exposed imagewise to actinic radiation. If the film support is transparent, the photosensitive layer may be exposed imagewise to actinic radiation either before or after stripping of the film support. In either case, the film support is necessarily stripped prior to development. Then, the non-imaged areas of the photosensitive layer are dissolved away using a liquid developer to form a resist image on the surface of the substrate. Thereafter, etching is effected to obtain an intended printed circuit board.

At present, a polyethylene terephthalate film is most popularly used as the film support because it has a high nerve and a good evenness. Since this film has polar groups in the molecular structure, it has a considerable adhesion to the photosensitive layer. In case a resist film comprising such a film support and a photosensitive layer is laminated onto a substrate such as a copper-clad epoxy resin plate, the substrate and/or the resist film is heated and pressure lamination is then effected so as to attain good adherence between the photosensitive layer and the substrate. If heating and/or pressure application is not uniform and/or the substrate is warped, uniform adhesion between the substrate and photosensitive layer cannot be attained, and therefore, when the film support is stripped, there is often caused such a trouble that part of the photosensitive layer remains attached to the film support and the former is removed together with the latter. It is not practically acceptable to subject the substrate having thereon such an incomplete lamination to the subsequent step such as development. Further, if the temperature at the heat-lamination step is low, the adhesion between the substrate and the photosensitive layer is sometimes insufficient, leading to such a trouble that, when the film support is stripped, the photosensitive layer is peeled off together with the film support. This undesirable trouble occurs when the adhesion between the film support and the photosensitive layer is larger than the adhesion between the substrate and the photosensitive layer.

Reduction of the thickness of the photosensitive layer is an effective means for improving the resolution of a resist image produced therefrom. However, if the thickness of the photosensitive layer is reduced, the absolute value of cohesion of the layer is lowered, and hence there is caused occurrence of such an undesirable phenomenon that the photosensitive layer is destroyed when the film support is stripped. Therefore, there is inevitably limitation with respect to the reduction of the thickness of the photosensitive layer.

The foregoing defects and disadvantages are inevitably involved in the conventional processes using liquid-development type photosensitive elements for producing photoresists.

It is therefore an object of this invention to provide a preformed photosensitive resist element useful for practicing a rapid and practical process for producing a durable image which is particularly useful as a photoresist advantageously employable for the production of a printed circuit board.

SUMMARY OF THE INVENTION

We have made intensive researches with a view to obviating the defects and disadvantages involved in the conventional techniques. As a result, it has been found that the purpose of our researches can be simply attained by the use of a photopolymerizable element comprising a layer made of a photopolymerizable composition and a film support made of a transparent material such as a transparent polymeric material and laminated on the surface of the photopolymerizable composition layer which support is soluble or dispersible in a developer consisting essentially of a liquid capable of substantially dissolving or dispersing therein the areas of the photopolymerizable composition layer other than those having a polymeric image produced by imagewise exposure. In order to produce a resist image on a substrate by the use of the above-mentioned photopolymerizable element, there is employed a process comprising applying the photopolymerizable layer of the element onto the substrate and exposing the photopolymerizable layer, imagewise, to actinic rays to form a polymeric image, directly followed by development without stripping from the layer the film suppport. In the process, the film support is advantageously washed away together with the areas of the photopolymerizable composition layer other than those having the polymeric image by using the developer.

DETAILED DESCRIPTION OF THE INVENTION

Essentially, in accordance with the present invention, there is provided a photopolymerizable element comprising a layer of a photopolymerizable composition and a transparent oriented film support laminated onto one surface of the photopolymerizable composition layer which support is soluble or dispersible in a liquid developer for the photopolymerizable composition layer and capable of transmitting actinic rays and which support is of a member selected from the group consisting of methyl methacrylate homopolymer and copolymers, vinyl chloride homopolymer and copolymers, polyvinyl alcohol, and mixtures thereof. The photopolymerizable element of the present invention may further comprise a strippable protective film provided on the other surface of the photopolymerizable composition layer for preventing blocking at the winding step and adhesion of dusts during handling and for other purposes.

A process for producing a negative image using the photopolymerizable element of the present invention is practiced, for example, as follows. If a photopolymerizable element comprising a photopolymerizable layer made of a photopolymerizable composition and capable of being dissolved or dispersed in a liquid developer and a film support attached to one surface of the layer is provided on the other surface of the photopolymerizable layer with a protective film, the protective film is firstly stripped. The surface of a photopolymerizable layer of the photopolymerizable element is laminated and attached to the surface of a substrate such as a copper-clad plate. Subsequently, the photopolymerizable layer is imagewise exposed to actinic radiation to form a polymeric image by photopolymerization of the photopolymerizable composition. The film support and the unexposed areas of the layer are then washed away with the liquid developer to form an image of a polymeric material on the surface of the substrate.

In case the so formed image of the polymeric material is used as a resist image for the production of a printed circuit board, the subsequent procedures are as follows. The resist image bearing substrate is dipped in an etching solution containing ferric chloride or the like, whereby the bared surface portions of the substrate which are made of copper or the like and unprotected by the resist image are etched away. The so treated substrate is picked up from the etching solution, and the resist image is removed to obtain a desired printed circuit board.

At the step of lamination of a photopolymerizable layer to a substrate, the temperature of the surface of the substrate and/or the surface of the photopolymerizable layer remote from a film support and the pressure to be applied between the substrate and the photopolymerizable layer may be varied depending on the kinds of the substrate and the photopolymerizable layer. But the temperature is usually about 0° to about 160° C., preferably about 10° to about 120° C. and the pressure is usually about 0.1 to about 20 Kg/cm$^2$·G, preferably about 0.5 to about 5.0 Kg/cm$^2$·G.

The photopolymerizable element of the present invention comprises, as essential constituents, a transparent oriented film support and a photopolymerizable layer typically including an organic binder selected from polymeric materials capable of being dissolved or dispersed in an organic solvent to be used as the developer, and optionally it further comprises a protective film.

In this invention, the transparent film support capable of being dissolved or dispersed in a developer is a film having orientation, such as a monoaxially or biaxially oriented film. As the materials of the support film, there can be mentioned methyl methacrylate homopolymer and copolymers with at least one of monomers such as methacrylic acid, acrylic acid, methyl acrylate, butyl acrylate, etc., vinyl chloride homopolymer and copolymers with at least one of monomers such as vinyl acetate etc., and polyvinyl alcohol, which are all easily available. In the case of the methyl methacrylate or vinyl chloride copolymers, the methyl methacrylate or vinyl chloride monomer units are preferably contained in an amount of at least 50% by weight, more preferably at least 70% by weight, most preferably at least 80% by weight. The viscosity average molecular weight of the polymeric material for the support film is not critical and the polymeric material may have any viscosity average molecular weight so far as it can be removed by dissolution or dispersion into a liquid developer at the step of development. The viscosity average molecular weight may usually be in the range of 5,000 to 1,000,000.

As described hereinbefore, the liquid developer to be used in this invention must be capable of dissolving or dispersing therein both of the unexposed areas of the photopolymerizable layer and the film support. As specific examples of an organic solvent as the developer, there can be mentioned ketones such as acetone and methyl ethyl ketone; esters such as methyl formate, methyl acetate, ethyl acetate and amyl acetates; chlorinated hydrocarbons such as chloroform, trichloroethylene, 1,1,1-trichloroethane, 1,1,2-trichloroethane and methylene chloride; aromatic hydrocarbons such as benzene, toluene and xylene; alicyclic hydrocarbons such as benzene, toluene and xylene; alicyclic hydrocarbons such as cyclohexane; alcohols such as methanol, ethanol and isopropanol; cellosolves such as methyl cellosolve; and tetrahydrofuran. In the case of a polyvinyl alcohol film support, an aqueous solvent may advantageously be employed as the developer. The term "aqueous solvent" as used herein includes water alone and an aqueous solution of an acid or an alkali such as sodium carbonate. These solvents may be used either alone or in mixture.

As an organic polymer binder that may be used in a photopolymerizable layer of the photosensitive element, there can be mentioned, for example, methyl methacrylate homopolymer and copolymers with at least one of monomers such as methacrylic acid, acrylic acid, methyl acrylate, butyl acrylate, etc., styrene-acrylonitrile copolymers, chlorinated polyolefins such as chlorinated polyethylene and chlorinated polypropylene, polyvinyl butyral and mixtures thereof. Of these organic polymer binders, methyl methacrylate homopolymer and copolymers are especially preferred from the viewpoint of the compatibility with a photopolymerizable monomer to be used for the photopolymerizable layer and/or the affinity with the liquid developer such as mentioned above. The viscosity average molecular weight of the organic polymer binder is not critical and the polymer binder may have any viscosity average molecular weight so far as it can be removed by dissolution or dispersion into a liquid developer at the step of development. The viscosity average molecular weight may usually be in the range of 5,000 to 1,000,000.

In general, an appropriate liquid developer is chosen according to the kinds of organic polymer binder for the photopolymerizable layer and polymeric material for the film support. For example, when the binder and the support film are of acrylic polymers, e.g., polymethyl methacrylate, ketones and/or chlorinated hydrocarbons may advantageously be used as the liquid developer, while ketones may advantageously be used for vinyl chloride type polymers. When the kind of organic binder is different from that of the support film, a common solvent for both of them or an appropriate mixture of solvents is chosen and employed as the liquid developer.

Development may be effected by dissolution of the unexposed areas of the photopolymerizable layer and the film support. Alternatively, development may be accomplished by swelling of the layer and/or the support and subsequent dispersion and removal thereof. For example, when polyvinyl butyral is used as the binder of the photopolymerizable layer and a polyvinyl alcohol film is used as the support, a liquid mixture of water and ethanol may be used as the liquid developer for dispersion development.

The photopolymerizable layer may comprise a photopolymerizable monomer, an organic polymer binder such as mentioned above, and a sensitizing agent such as a photopolymerization initiator. Ethylenically unsaturated compounds, especially acrylic polyfunctional monomers, are suitably employed as the photopolymerizable monomer. As the photopolymerizable monomer, those having at least 2 unsaturated bonds in their molecule are preferred because they provide crosslinkages by photopolymerization when exposed to actinic radiation. As acrylic monomers having 2 unsaturated bonds, there can be mentioned, for example, diacrylates such as polyethylene glycol diacrylate and polypropylene glycol diacrylate, and dimethacrylates such as polyethylene glycol dimethacrylate and polypropylene glycol dimethacrylate, and as acrylic monomers having 3 unsaturated bonds, there can be mentioned, for example, triacrylates such as pentaerythritol triacrylate and trimethylolpropane triacrylate and trimethacrylates such as pentaerythritol trimethacrylate and trimethylolpropane trimethacrylate. The viscosity average molecular weight of polyethylene glycol diacrylate, polypropylene glycol diacrylate, polyethylene glycol dimethacrylate and polypropylene glycol dimethacrylate as mentioned above is not critical but is usually up to 10,000, preferably up to 5,000. Other ethylenically unsaturated compounds that can be used as the photopolymerizable monomer are, for example, those as disclosed in U.S. Pat. No. 3,469,982, polyvinyl cinnamate and polyacrylamide. These monomers may be used either alone or in mixture. The ratio of the amount of the photopolymerizable monomer to the amount of the organic polymer binder may be chosen within a broad range according to the kinds of monomer and binder so far as a desired image can be obtained from the photopolymerizable layer prepared therefrom. In general, the photopolymerizable monomer is used in an amount of 10 to 500 parts by weight, preferably 20 to 200 parts by weight, per 100 parts by weight of the binder.

The kind of photopolymerization initiator to be used as the sensitizing agent is not particularly critical in this invention, and any of known photopolymerization initiators can be used. Specific examples of such photopolymerization initiators include carbonyl compounds such as benzoin, benzoin $C_1$–$C_4$ alkyl ethers, benzophenone, anthraquinone, 2-methylanthraquinone, 2-tert-butylanthraquinone, 9,10-phenanthrenequinone, diacetyl and benzil; peroxides such as hydrogen peroxide, di-tert-butyl peroxide, benzoyl peroxide and methyl ethyl ketone peroxide; organic sulfur-containing compounds such as di-n-butyl disulfide, 2-mercaptobenzothiazole, 2-mercaptobenzoxazole, 2-mercaptobenzimidazole, thiophenol, thiocresol, carboxymethyl-N,N-dimethyldithiocarbamate and ethyl trichloromethanesulfonate; redox initiators such as ferrous ion-peroxide such as hydrogen peroxide, ferric ion-peroxide such as hydrogen peroxide and ferrous ion-persulfate ion; photoreducible dyes such as Rose Bengale, Erythrocin, Eosine, acriflavine and Thionine; halogen compounds such as chloromethylnaphthyl chlorides, phenacyl chloride, chloroacetone, β-naphthalenesulfonyl chloride and xylenesulfonyl chlorides; and azo or diazo compounds such as α,α'-azobisisobutyronitrile, 2-azobis-2-methylbutyronitrile and a diazonium salt, e.g. a diazonium chloride of p-aminodiphenylamine. In the above-mentioned redox initiators, the source of ferrous ion may be ferrous chloride, the source of ferric ion may be ferric chloride and the source of persulfate ion may be ammonium persulfate. The ratio of the amount of the photopolymerization initiator to the amount of the photopolymerizable monomer can be chosen within a broad range according to the kinds of monomer and photopolymerization initiator so far as a desired image can be obtained. In general, it is preferred that the amount of the photopolymerization initiator be 0.1 to 20 parts by weight, especially 1 to 10 parts by weight, per 100 parts by weight of the monomer.

In this invention, it is to be noted that the photopolymerizable layer may be of a multi-layer type in which the respective layers have successively increased concentrations of the photopolymerization initiator with increase in their distances from the film support. In the case of such a multi-layer type photopolymerizable layer, insufficient exposure to actinic radiation in the portions of the layer remote from the film support is compensated by the increased amount of the initiator to provide substantially uniform photopolymerization with respect to the vertical direction of the photopolymerizable layer. The substantially uniformly photopolymerized image gives, after development thereof, an image resist having substantially vertical lateral faces. Usually, a photopolymerizable layer having two layers differing in the concentration of the initiator is provided for attaining the above-mentioned purpose. In this case, the concentration of the photopolymerization initiator in the layer on the side remote from the film support is suitably 1.5 to 10 times that in the layer on the side of the film support.

The photopolymerizable layer may include a polymerization inhibitor. As the polymerization inhibitor, there can be used, for example, p-methoxyphenol, hydroquinone, hydroquinones substituted with an alkyl group such as methyl or ethyl or with an aryl group such as phenyl, t-butylcatechol, pyrogallol, cuprous chloride, phenothiazine, chloranil, naphthylamines, β-naphthol, 2,6-di-t-butyl-p-cresol, pyridine, nitrobenzene, dinitrobenzenes, p-toluidine, Methylene Blue and copper salts of organic acids such as acetic acid. The amount of the polymerization inhibitor may vary according to the kinds of photopolymerizable monomer and polymerization inhibitor. In general, however, the polymerization inhibitor is used in an amount of 0.01 to 5 parts by weight per 100 parts by weight of the photopolymerizable monomer.

In connection with the use of a polymerization inhibitor, it is to be noted that the photopolymerizable layer may be of another multi-layer type in which the respective layers have successively decreased concentrations of the polymerization inhibitor with increase in their distances from the film support. In the case of such a multi-layer type photopolymerizable layer, substantially uniform photopolymerization with respect to the vertical direction of the photopolymerizable layer is attained by exposure of the layer to actinic radiation. The substantially uniformly photopolymerized image gives, after development thereof, an image resist having substantially vertical lateral faces. Usually, for attaining the above-mentioned purpose, there is provided a photopolymerizable layer having two layers differing in the concentration of the inhibitor. In this case, the concentration of the polymerization inhibitor in the layer on the side remote from the film support is suitably 0.01 to 0.5 time that in the layer on the side of the film support.

In order to increase the visibility of the image, a coloring agent may be incorporated into the photopolymerizable layer. Any of coloring agents as used commonly in this field may be employed. For example, there can be used titanium dioxide, carbon black, Crystal Violet, azo pigments, iron oxides, phthalocyanine pigments, Methylene Blue, Rhodamine B, Fuchsine, Auramines, azo dyes and anthraquinone dyes. When a pigment is used as the coloring agent, it is incorporated in an amount of 0.1 to 25 parts by weight, preferably 0.1 to 5 parts by weight, per 100 parts by weight of the sum of the binder and the monomer. When a dye is used as the coloring agent, it is incorporated in an amount of 0.01 to 10 parts by weight per 100 parts by weight of the sum of the binder and the monomer.

A nitrogen-containing heterocyclic compound may be incorporated into the photopolymerizable layer according to need. Any of nitrogen-containing heterocyclic compounds as used commonly in this field can be used. For example, there may be used benzimidazole, 2-aminobenzimidazole, 5-nitrobenzimidazole, 5-methylbenzimidazole, benzotriazole, 1-chlorobenzotriazole and 2-aminobenzothiazole. By incorporation of such a nitrogen-containing heterocyclic compound into the photopolymerizable layer, the tack of the photopolymerizable layer to a metal-clad substrate or a metal substrate can be improved. In general, it is preferred that the nitrogen-containing heterocyclic compound be incorporated in an amount of 0.1 to 10 parts by weight, especially 0.5 to 5 parts by weight, per 100 parts by weight of the sum of the binder and the photopolymerizable monomer. Alternatively or additionally, an adhesive may be applied onto the substrate for improving the adherence between the photopolymerizable layer and the substrate.

Further, a plasticizer may be incorporated into the photopolymerizable layer according to need. Any of plasticizers are used commonly in this field can be used in this invention. For example, there can be used phthalic acid esters such as dimethyl phthalate, diethyl phthalate, dibutyl phthalate and dioctyl phthalate; glycol esters such as dimethyl glycol phthalate and ethyl phthalyl ethyl glycolate; phosphoric acid esters such as tricresyl phosphate and triphenyl phosphate; and esters of aliphatic dibasic acids such as diisobutyl adipate, dioctyl adipate and dimethyl sebacate. The plasticizer may be used in an amount of 0.1 to 30 parts by weight, preferably 2 to 10 parts by weight, per 100 parts by weight of the sum of the organic polymer binder and the photopolymerizable monomer.

The photopolymerizable element of this invention is easily prepared, for example, as follows. A solution of a photopolymerizable composition is coated onto a plate or film having release properties to form a photopolymerizable layer and the photopolymerizable layer is transferred to a support film to give a photopolymerizable element having no protective film. In the case of a photopolymerizable element having a protective film, a solution of a photopolymerizable composition may be coated onto a protective film to form a photopolymerizable layer and the photopolymerizable layer with the protective film is laminated onto a support film.

The photopolymerizable element of this invention comprises an oriented transparent film support made preferably of a polymeric material selected from the polymers mentioned hereinbefore and a photopolymerizable layer. An appropriate liquid developer capable of dissolving or dispersing therein both of the film support and the unexposed portions of the layer is chosen from among the aforementioned solvents and is used for development. However, it should be noted that advantageously employable liquid developers are not limited to those exemplified hereinbefore.

The term "liquid developer" as used herein is intended to mean a liquid capable of removing the film support and the unexposed areas of the layer to form an image. Accordingly, even if a liquid is incapable of dissolving away the film support and/or the unexposed areas of the layer, it can be used as the developer when it is capable of removing, by any means, the film support and the unexposed areas of the layer by any treatment with the liquid developer.

The thickness of the photopolymerizable layer that is used in this invention is preferably 0.1 to 1,000$\mu$, more preferably 0.5 to 100$\mu$, most preferably 5 to 70$\mu$. The thinner the photopolymerizable layer, the more the resolution is improved.

The thickness of the oriented transparent film support is preferably 5 to 100$\mu$, more preferably 10 to 50$\mu$, most preferably 10 to 30$\mu$. This is so because the transparent film support must impart to the photopolymerizable element a strength sufficient to resist the stripping of any protective film and to resist the lamination to the substrate so as to avoid deformation of the photopolymerizable element, and also because the time required for development can be shortened as the transparent film support is thin. The oriented film support may be obtained by a customary process, for example, stretching-orientation or rolling-orientation of an unoriented polymer film. Either a monoaxially or a biaxially oriented film support may be used in the present invention although a biaxially oriented film support is most suitably employed. In the case of the monoaxially oriented film support, orientation in the longitudinal direction is preferred. In the case of the biaxially oriented film support, the degree of orientation may be either the same or different between in the longitudinal direction and in the lateral direction of the film. The degree of orientation cannot generally be specified because the choice thereof is highly dependent on the kind of polymer material of a film support to be used, but may usually be in the range of up to 12 times, preferably in the range of from 1.5 to 10 times, more preferably in the range of from 2 to 6 times, especially when consideration is given to a stable and continuous operation of orientation.

An oriented transparent film support is, in general, thin and nevertheless imparts a sufficient nerve to a photopolymerizable element as compared with an unoriented film support. Sufficient nerve of the element is important both at the time of the stripping of any protective film and at the time of lamination. If the element has insufficient nerve, the stripping of any protective film and the lamination cause deformation (wrinkling) and/or breakage of the element because the element cannot resist tension generated at the time of stripping of the protective film and lamination.

An oriented film support is also advantageous from the viewpoint of development time. The dissolution of an oriented film support is facilitated by the residual internal stress due to molecular orientation. This is so because the residual internal stress is relaxed by contact with a developer solvent. Further, the orientation of a polymer film provides strength and flexibility, being very beneficial in practicing a process of producing an image using a photopolymerizable element.

The film support is desirably as thin as possible as in the case of the present invention from the viewpoints of resolution, development time and life of developer. By the use of a thin film support, the range of scattering of actinic rays in the film can be narrowed to improve the resolution of an image. A thin film support shortens the development time. Where the film support is thin, the amount of the film material dissolved into a developer liquid is of course small, leading to the prolonged life of the developer liquid. An oriented film support may be thin because, even if thin, it permits lamination of a photosensitive layer onto a substrate to be carried out without any difficulty, as opposed to an unoriented film support.

An appropriate protective film may be chosen from among known materials. As the protective film, there can be mentioned, for example, a polyethylene terephthalate film, a polypropylene film, a polyethylene film, a cellulose triacetate film, a cellulose diacetate film, a polyamide film, a polytetrafluoroethylene film, a paper, a polyethylene-laminated paper and a polypropylene-laminated paper. The thickness of the protective film may be 8 to 80$\mu$, preferably 10 to 30$\mu$.

As the substrate for producing thereon an image using the photopolymerizable element of this invention, there can be mentioned, for example, a laminate board with its surface or surfaces etchable by an etching liquid, a metal plate such as a copper, aluminum, iron, brass, silver, gold or stainless steel plate, a glass plate and a stone plate. The laminate boards with its surface or surfaces etchable, e.g. copper-clad substrate and aluminum-clad substrate, are useful for producing a printed circuit board using the photopolymerizable element of the present invention.

As the light source for exposure to actinic radiation, there can be used, for example, a high pressure mercury lamp, a super high pressure mercury lamp, a low pressure mercury lamp, a xenon lamp, a carbon arc lamp and a fluorescent lamp. Besides actinic rays from these light sources, there may be used X-rays, laser rays and electron rays for imagewise exposure.

As will be apparent from the foregoing illustration, the troublesome step of stripping the film support before or after exposure can be omitted when the photopolymerizable element of this invention is used. Since the film support need not be stripped, the thickness of the photopolymerizable layer can be remarkably reduced without the cohesion of the photopolymerizable layer being taken into account. As a result, the resolution of the image can be remarkably improved. Further, when the photopolymerizable element of the present invention is laminated to a substrate with heating, since the film support need not be stripped, the temperature need not be elevated to such a high level as adopted in the conventional techniques as to attain good adherence between a photosensitive layer and the substrate. Even if the adhesion between the photopolymerizable layer and the substrate is small, good results are obtained if only the adhesion between the image formed by the development and the substrate is sufficient to resist the subsequent treatment such as etching. Therefore, handling of photosensitive element can be remarkably simplified and facilitated in this invention. Still further, nonuniform adhesion between the photosensitive layer and the substrate owing to nonuniform heating or pressing is no longer a problem in this invention.

The photopolymerizable element according to this invention may advantageously be utilized for the production of printed circuit boards, but the application field of this invention is not limited to the production of printed circuit boards. For example, the element of this invention is effectively applicable to chemical milling or processing of semiconductors. The element can also be applied to the production of photoreliefes such as those for a printing plate, a name plate, decorative articles and the like.

The photopolymerizable element according to this invention can be used advantageously in the various conventional methods for producing printed circuit boards by means of photoresists. Two distinct methods of the manufacture of printed circuit boards for use in electrical or electronic equipments have, in general, been proposed in the prior art. One method is called the "subtractive" method, and the other method is called the "additive" method. The "subtractive" method utilizing a photographic reproduction process consists, in general, in clothing one or both sides of an insulating substrate with a conductive metal foil, covering the conductive metal-clad substrate with a photosensitive material layer, exposing the photosensitive layer to actinic radiation through a pattern mask to form a latent image of the desired circuit and subjecting the image-bearing substrate to development using a solvent capable of removing the non-imaged portions of the photosensitive material layer thereby to form a photoresist having a positive image of the desired circuit, followed by etching away of the metal foil in the areas unprotected by the photoresist to form the circuit conductor. When the substrate has on its both sides conductive metal layers and is provided with through-holes, following etching, the entire surfaces of both sides are covered, except portions corresponding to the through-holes, with a resist and the inner wall surfaces of the through-holes are plated with an electroless deposit of a conductive metal, optionally followed by electro-deposition of a conductive metal on said electroless deposit (see, for example, German Offenlegungsschrift No. 24 27 610). An alternative to the "subtractive" method has been proposed heretofore, and is known as the "additive" method of manufacturing printed circuit boards. The "additive" method utilizing a photographic reproduction process consists, in general, in covering a bare substrate free of any conductive metal foil with a photosensitive material layer, exposing the photosensitive layer to actinic radiation through a pattern mask to form a latent negative image of the desired circuit and subjecting the image-bearing substrate to development using a solvent capable of removing the non-imaged portions of the photosensitive material layer thereby to form a photoresist having a negative image of the desired circuit, followed by electroless deposition of a conductive metal onto the areas unprotected by the photoresist, optionally further followed by electro-deposition of a conductive metal thereonto, to form the conductor portions of the circuit. As an improvement of the "additive" method, there is known a method which involves the steps of punching a bare substrate to provide necessary through-holes, plating an initial thin deposit of a conductive metal over the entire surface using an electroless metal plating bath, then applying and developing a photoresist to form a negative image of the desired circuit, followed by additional metal plating by electro-deposition to build up the conductor portions of the circuit to a desired thickness, whereupon the photoresist is removed from the non-circuit portions and the initial thin electroless metal deposit is etched away therefrom. In any of the methods in which an electroless plating procedure is involved, the catalyst for electroless plating is generally applied on the surface to be plated or incorporated in the substrate itself.

As is easily understood to those skilled in the art, the photopolymerizable element according to the present invention can be advantageously utilized for formation of the photoresists functioning as the etching-resist and the plating-resist in the above-mentioned "subtractive" method and "additive" method, respectively.

Furthermore, it is to be noted that as the modification of the above-mentioned "subtractive" method it is known to provide printed circuit boards of the type in which the substrate has on its both sides conductor circuits and the conductor circuits formed on the opposite sides have electrical connection therebetween through conductive metal layers formed on the inner wall surfaces of the through-holes of the substrate. The photopolymerizable element of this invention is applicable, with great advantages, especially to the manufacture of printed circuit boards of the type as mentioned above. In the conventional technique, the printed circuit of this type is formed by the method comprising forming a resist, by using an etching-resistant metal or ink having a masking capacity, on both surfaces of a conductive metal-clad substrate and the inner wall surfaces of the through-holes formed in the substrate, said inner wall surfaces having thereon respective conductive metal layers, and subjecting the resulting resist-bearing substrate to etching whereby predetermined, resist-unprotected areas of both surfaces of the metal-clad substrate are etched away. In this conventional technique, the resist can be easily formed on the surfaces of the substrate, but it is difficult to form a resist securely on the inner wall surfaces of the through-holes. Therefore, there is a tendency that the conductive metal formed on the inner wall surfaces of the through-holes is also etched, thus causing the thickness of the conductive metal layer to be reduced in the etched portions of the inner wall surfaces of the through-holes. As a result, the resistance is increased in these portions, leading to lowering of the performance of the printed circuit board.

As a means for overcoming the foregoing defects, there has recently been proposed an improved method for forming printed circuit boards from a conductive metal-clad substrate having through-holes with their respective inner wall surfaces covered with conductive metal layers. The improvement according to the method consists in covering, with photosensitive layers, the surfaces of both sides of the metal-clad substrate including both openings of each of the through-holes thereby to close the openings of the through-holes, so that the conductive metal layer on the inner wall surface of each of the through-holes is protected from etching in the subsequent step for forming the circuit conductors by etching (see, for example, Japanese Patent Application Publication No. 3746/1971). In this improved method, for covering the surfaces of both sides of the metal-clad substrate with the photosensitive layers, there may advantageously be employed a photosensitive element comprising a releasing support such as a release paper and a photosensitive resin layer formed on said support and optionally a protective film provided on the surface of said layer remote from the releasing support. Examples of such a photosensitive element include Riston (registered trademark of a product manufactured and sold by Du Pont Company, U.S.A.)

and Laminar (registered trademark of a product manufactured and sold by Thiokol/Dynachem Corp., U.S.A.). As described, Japanese Patent Application Publication No. 3746/1971 discloses a method which comprises applying one side of a photosensitive resin layer having on its other side a releasing support onto the surfaces of both sides of an insulating substrate having thereon conductive metal layers such as thin copper layers and having through-holes thereby to effect at least closure of both openings of the through-holes; in either order, imagewise exposing the photosensitive resin layers on both sides of the substrate to actinic radiation to form predetermined insolubilizable pattern images covering and closing at least both openings of each of the through-holes and removing the releasing supports from the photosensitive resin layers, followed by development; and etching the conductive metal layers in the areas other than the areas of said images as masking resists. In practicing this process, the releasing support must be removed from the photosensitive resin layer before the imagewise exposure if the releasing support is opaque, or before or after the imagewise exposure if the releasing support is transparent. In general, a photosensitive resin having a high tack is used for the photosensitive resin layer so as to attain a good adhesion between the photosensitive resin layer and the conductive metal layer, and in addition, when the photosensitive resin layer is laminated to the conductive metal layer, lamination is effected under application of pressure so as to secure good adherence. Accordingly, it is considerably difficult to remove the releasing support from the photosensitive resin layer having such a high tack. For this reason, a releasing support having good release characteristics, for example, a synthetic resin film or a waxed paper, is ordinarily used. Even in case such a releasing support having good release characteristics is used, however, various troubles tend to occur when the releasing support is removed from the photosensitive resin layer. For example, the photosensitive resin layer is peeled off together with the releasing support from the conductive metal layer, or pinholes are liable to be formed in the photosensitive resin layer. Further, adhesion of dusts are caused due to static charge generated by the removal of the releasing support. Therefore, the above-mentioned method cannot be commercially applicable to the production of printed circuit boards having good through-holes.

All of the foregoing disadvantages accompanying the conventional methods for the production of printed circuit boards can be eliminated according to a method using the photopolymerizable element of this invention. Differently stated, by the use of the element of this invention, printed circuit boards having good conductive metal layers on the inner wall surfaces of the through-holes can be prepared very simply while omitting the step of removing the releasing support from the photosensitive resin layer.

For example, an advantageous method for producing a printed circuit board using the photopolymerizable element of the present invention comprises the steps of:

(1) applying, to the surfaces of both sides of an insulating substrate having on its both sides conductive metal layers and having through-holes with their respective inner wall surfaces covered with conductive metal layers, a surface of the photopolymerizable composition layer of the element of the present invention to cover and close at least both openings of each of the through-holes with the photopolymerizable composition layer, while the other surface of the photopolymerizable composition layer has adhered to the soluble or dispersible transparent oriented film support, the application of the surface of the photopolymerizable composition layer to the surface of the substrate being effected after stripping of a protective film if a protective film has been provided on the surface of the photopolymerizable composition layer remote from the film support;

(2) exposing the photopolymerizable composition layers on both sides of the substrate, imagewise, to actinic radiation through the respective film supports to form in the layers polymeric images covering at least both openings of each of the through-holes;

(3) washing away with the developer the film supports and the areas of the layers other than those having the polymeric images to form polymeric image patterns on both sides of the substrate; and (4) etching the conductive metal layers in the areas other than the areas of the polymeric image patterns as masking resists.

Other objects, features and advantages of the above-mentioned method using the photopolymerizable element of this invention will be better understood from the description taken in connection with the accompanying drawings in which:

Referring now to FIGS. 1 to 9, the method of the producing a printed circuit board by the use of a negative working photopolymerizable element of this invention will be explained by way of example.

Figure 1:
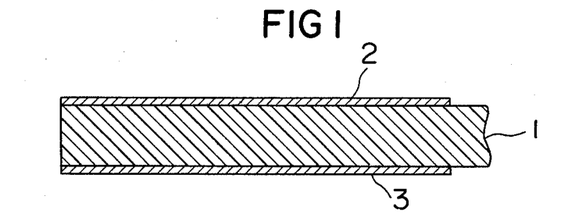
FIGS. 1 to 3 and 5 to 9 are diagrammatic sectional views illustrating by way of example the successive steps of manufacturing a printed circuit board according to the above-mentioned method.
Figure 2:
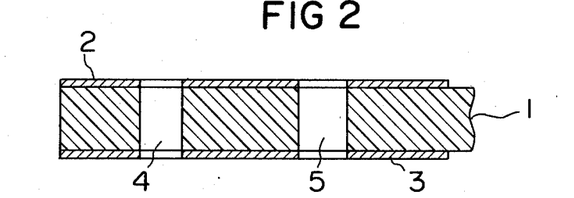
Figure 3:
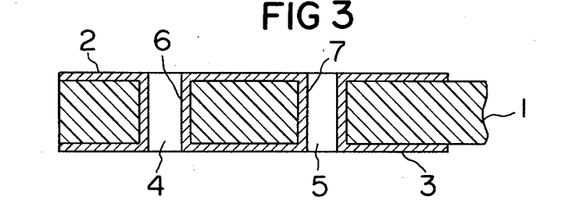
Figure 4:
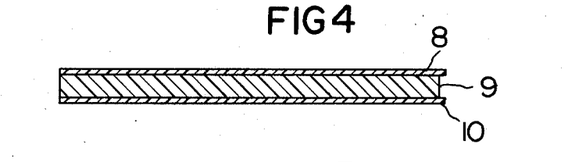
FIG. 4 is a diagramatic sectional view of one form of the photopolymerizable element of this invention that can be used in practicing the above-mentioned method.
Figure 5:
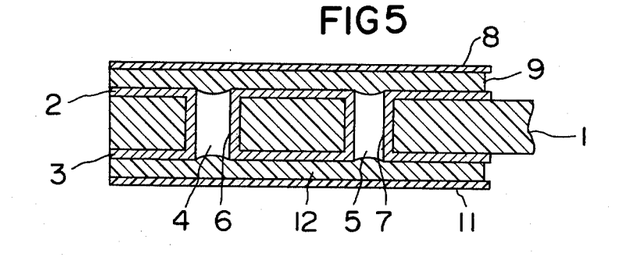
Figure 6:
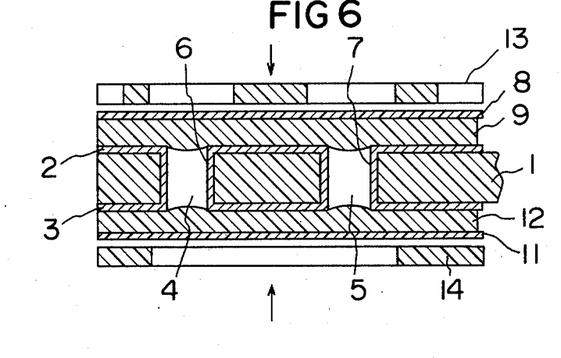
Figure 7:
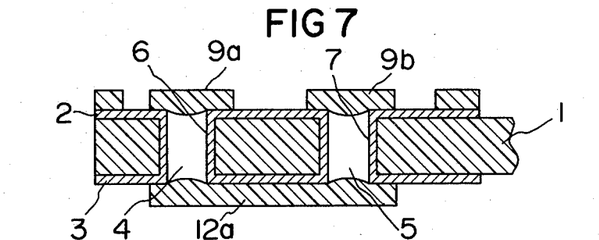
Figure 8:
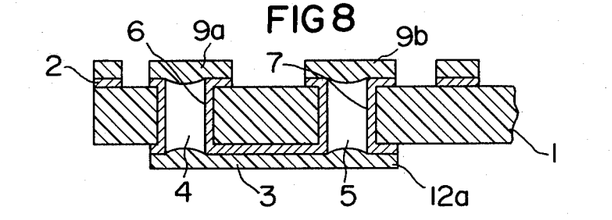
Figure 9:
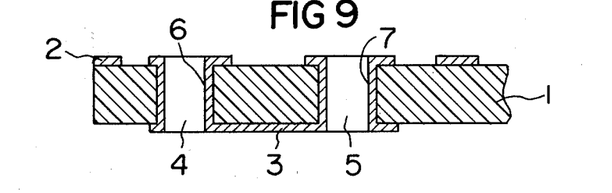

As is shown in FIG. 1, both surfaces of an insulating substrate 1 made of, for example, a phenolic or epoxy resin are clad with copper foils to form thin copper layers 2 and 3. Then, as is shown in FIG. 2, through-holes 4 and 5 are formed at predetermined portions by drilling or punching. In FIG. 3, the inner wall surfaces of the through-holes 4 and 5 are subjected to electroless plating to form an initial thin deposit of copper and subsequently, to electro-plating to form through-hole conductor layers 6 and 7 of the desired thickness, which are thin copper layers. If the photopolymerizable element has a protective film 10 made of polyethylene or the like as is shown in FIG. 4, the protective film is peeled off. The surfaces of photopolymerizable layers 9 and 12, which are remote from film supports 8 and 11, are applied to both surfaces of the copper-clad insulating substrate under application of an appropriate pressure at about 0° to about 160° C. to form a laminate board, whereby at least both openings of each of the through-holes 4 and 5 whose inner wall surfaces have respectively the through-hole conductor layers 6 and 7 are covered with the photopolymerizable layers 9 and 12 as is shown in FIG. 5. The thickness of the photopolymerizable layers 9 and 12 is preferably 0.5 to 100μ, more preferably 5 to 70μ, though it is not particularly critical. Then, as is shown in FIG. 6, the photopolymerizable layers are imagewise exposed through negative films 13 and 14 to actinic radiation to form in the photopolymerizable layers polymeric images insoluble in the liquid developer. Then, as is shown in FIG. 7, the film supports 8 and 11 and the unexposed non-imaged areas of the layers are dissolved away or dispersed away and removed using a liquid developer by means of an adequate development method such as a spray development method. In this printed circuit board-producing method, it is indispensable that at least both openings of each of the through-holes 4 and 5 should be completely covered with photopolymerized areas 9a, 9b and 12a insoluble in the liquid developer. The development may be effected in sequence or simultaneously for each of both sides of the laminate board. Subsequently, the resulting board is dipped in an etching solution containing ferric chloride or the like to effect etching of the thin copper layers 2 and 3. The portions of the thin copper layers other than those covered with the insoluble photopolymerized areas 9a, 9b, 12a, etc. of the polymeric images as masking resists are etched away with the etching solution to form desired conductor patterns as is shown in FIG. 8, followed by washing with water. Then, as is shown in FIG. 9, the insoluble photopolymerized areas 9a, 9b, 12a, etc. of the polymeric images are removed by dipping in methylene chloride or the like, followed by washing. According to need, the thin copper layers 2 and 3 and the through-hole conductor layers 6 and 7 are plated with gold or solder. Thus, there is obtained a printed circuit board having excellent quality through-hole conductor layers 6 and 7.

As will be apparent from the foregoing illustration, when a printed circuit board is produced according to the method using the element of this invention, the step of removing the releasing support is not needed, leading to the simplification of the manufacturing process. Further, such problems accompanying the conventional method as the peeling-off of a photosensitive resin layer from the conductive metal layer, the formation of pinholes and the adhesion of dusts by static charge at the step of stripping a releasing support need not be cared for at all in this method. Accordingly, a printed circuit board having through-holes with their respective inner walls covered by excellent conductor layers can be mass-produced, without giving poor quality products, with commercial advantages.

Further, it is to be noted that the photopolymerizable element according to this invention may advantageously be manufactured in the form of a longitudinally elongated strip that can be wound into a roll, from the viewpoint of handling, storage, etc.

The following Examples illustrate this invention in more detail, but are not to be construed as limiting the scope thereof.

In Examples, "resolution" is evaluated as follows. According to the process of this invention, a plurality of polymeric images are produced using a photopolymerizable element and a plurality of mask films which differ in the line width of the image composed of transparent lines having a given width and opaque lines having the same width as that of the transparent lines. Each polymeric image is visually observed through a microscope to determine whether or not the polymeric image has recognizable lines. The minimum line width among the line widths of the images of those mask films which can give a polymeric image having recognizable lines is defined as the "resolution" of the photosensitive element.

The viscosity average molecular weight ($\overline{M}v$) shown in this specification is calculated from the intrinsic viscosity [η] at 25° C. of a solution of a polymeric material in a solvent, using the following equation. The intrinsic viscosity is examined using Ostwald's viscometer.

$$[\eta] = K\overline{M}_v{}^\alpha$$

(wherein K and α are constants inherent in the polymeric material).

For example, with respect to polymethyl methacrylate and polystyrene, solvents to be used and constants K and α are listed as follows.

|  | Solvent | K | α |
| --- | --- | --- | --- |
| Polymethyl methacrylate | chloroform | 4.85 × 10$^{-6}$ | 0.80 |
| Polystyrene | benzene | 1.0 × 10$^{-4}$ | 0.74 |

The viscosity average molecular weight ($\overline{M}v$) is substantially the same as the weight average molecular weight ($\overline{M}w$).

In Examples, a film support is often referred to simply as "support".

EXAMPLE 1

A solution was prepared of the following ingredients:

| | |
| --- | --- |
| Polymethyl methacrylate [Delpowder (registered trademark) 80N manufactured and sold by Asahi Kasei Kogyo K. K., Japan] | 30 g |
| Trimethylolpropane triacrylate | 20 g |
| Benzophenone | 0.5 g |
| Michler's ketone | 0.25 g |
| Malachite Green (oxalate) | 0.1 g |
| Methyl ethyl ketone | 150 g |

The solution was coated onto a 50 μ-thick polypropylene film and dried to form a photopolymerizable layer having a dry thickness of 10μ. Then, the photopolymerizable layer was laminated onto a 20 μ-thick biaxially oriented polymethyl methacrylate film (stretching: by 2.5 times in the longitudinal direction and by 2.0 times in the lateral direction) as a support to form a photosensitive element.

A copper-clad epoxy resin-fiber glass substrate was degreased with trichloroethylene, dipped for 30 seconds in a 10% by weight aqueous solution of hydrochloric acid, washed with water, coarsened by a surface abrasion machine [a roll Scotchbrite (registered trademark) 7VF (manufactured and sold by Minnesota Mining and Manufacturing Company, U.S.A.) was used], washed with water and then dried.

The polypropylene film was stripped and the photopolymerizable layer with its support was laminated through nip rolls onto the so treated copper-clad epoxy resin substrate heated at 100° C. to form a laminated board. The lamination pressure was 4.0 Kg/cm$^2$·G and the lamination speed was 1.5 m/min.

The photopolymerizable layer of the laminate board so formed was exposed for 45 seconds through a negative image to actinic rays from a 3 KW high pressure mercury lamp (manufactured by Ushio Electric Inc., Japan) located at a distance of 50 cm from the surface of the support. Then, trichloroethylene was jetted for 60 seconds to the laminate board from a spray nozzle to dissolve away and remove the support film and the unexposed areas of the photopolymerizable layer, whereby a resist image was obtained. The resolution was examined and clear lines of 20μ in width were observed.

A 50° C, 45° Baumé ferric chloride solution was jetted to the laminate board by a nozzle type etching machine to remove copper at the areas unprotected by the resist image. By this etching treatment, the resist image did not undergo any change and remained firmly adhered to the copper-clad substrate. The etched laminate board was then washed with water and dried, and the resist was removed using methylene chloride. A clear copper pattern was obtained.

EXAMPLE 2

Substantially the same solution as prepared in Example 1 except that 30 g of chlorinated polyethylene [Super Chlon (registered trademark) 907LTA manufactured and sold by Sanyo-Kokusaku Pulp Co., Ltd., Japan] was used instead of 30 g of the polymethyl methacrylate was prepared, and the solution was coated onto a 50 μ-thick polypropylene film to form a photopolymerizable layer having a dry thickness of 15μ. The coated film was laminated onto a 20 μ-thick biaxially oriented polyvinyl chloride film (stretching: by 2.5 times in the longitudinal direction and by 2.5 times in the lateral direction) as a support to obtain a photosensitive element. The polypropylene film was stripped and the photopolymerizable layer with its support was laminated onto a copper-clad epoxy resin substrate treated in the same manner as in Example 1 and heated at 100° C. to form a laminate board.

The polyethylene terephthalate film was stripped, and the photopolymerizable layer with its support was laminated with pressing onto a copper-clad epoxy resin substrate heated at 100° C. to form a laminated board. The lamination pressure was 2.5 Kg/cm$^2$·G and the lamination time was 30 seconds. Then, the photopolymerizable layer of the laminate board was exposed for 30 seconds through a negative image to actinic rays from a 2 KW super-high pressure mercury lamp (manufactured by Ork Manufacturing Co., Ltd., Japan) located at a distance of 50 cm from the surface of the support. Tetrahydrofuran was jetted for 45 seconds to the laminate board from a spray nozzle to dissolve away and remove the film support and the unexposed areas of the photopolymerizable layer and obtain a resist image. The resolution was examined, and clear lines of 30μ in width were observed.

The laminate board was then etched by a spray nozzle type etching machine under the same conditions as adopted in Example 1. The resist image did not undergo any change and it remained adhered firmly to the copper-clad substrate. The laminate board was washed with water and dried, and the resist was removed using methylene chloride to obtain a good copper pattern.

COMPARATIVE EXAMPLE 1

A photopolymerizable layer formed on a 50 μ-thick polypropylene film as a support in the same manner as described in Example 1 was laminated onto a copper-clad epoxy resin substrate heated at 100° C. in substantially the same manner as in Example 1 to form a laminate board. Exposure to actinic rays was effected in substantially the same manner as described in Example 1. When the polypropylene film as the support was stripped, the photopolymerizable layer was destroyed and remained adhered to both the film support and the copper surface. Accordingly, it was practically useless to subject the resulting laminate board to development.

EXAMPLE 3

A solution was prepared of the following ingredients:

| | |
|---|---|
| Methyl methacrylate/acrylic acid copolymer (molar ratio = 95/5 ; $\overline{Mv}$ = 150,000) | 50 g |
| Tetraethylene glycol diacrylate | 40 g |
| Methyl Violet (C. I. 42535) | 0.2 g |
| 2-Ethylanthraquinone | 4 g |
| Methyl ethyl ketone | 300 g |

The solution so prepared was coated onto a 40 μ-thick polyethylene film and dried at 80° C. for 2 minutes to form a photopolymerizable layer having a dry thickness of 30μ. A 20 μ-thick oriented polyvinyl alcohol film (stretching: by 2.0 times in the longitudinal direction and by 2.0 times in the lateral direction) as a support was laminated onto the photopolymerizable layer under application of pressure to form a photosensitive element.

The polyethylene film which was a protective film of the photosensitive element was stripped. Then, the photopolymerizable layer with its support was laminated onto a copper-clad epoxy resin-fiber glass substrate treated in the same manner as in Example 1 and heated at 80° C., which copper plate had a protective coating on the other surface thereof. Subsequently, the photopolymerizable layer was exposed for 40 seconds to actinic rays from the same high pressure mercury lamp as used in Example 1, which was located at a distance of 50 cm from the surface of the support. Development was effected for 90 seconds using a 3% by weight aqueous solution of sodium carbonate having a temperature of 40° C. Thus, the polyvinyl alcohol film as the support and the unexposed areas of the photopolymerizable layer were dissolved and removed to obtain a desired resist image.

The same ferric chloride solution as used in Example 1 was jetted for 2 minutes to the resist image-bearing copper plate to effect etching. After water-washing and drying, the resist was removed using methylene chloride. The resulting copper pattern was clear and good in shape of lines.

EXAMPLE 4 AND COMPARATIVE EXAMPLE 2

A 25 μ-thick unoriented polyvinyl alcohol film was prepared by melt-extruding polyvinyl alcohol (degree of saponification: 70%; $\overline{Mv}$=60,000). A 25 μ-thick oriented polyvinyl alcohol film was prepared by melt-extruding the same polyvinyl alcohol as in the case of the unoriented film to form a 160 μ-thick film and stretching the film so formed by 2.5 times in the longitudinal direction and by 2.5 times in the lateral direction. The oriented film was so sufficient in nerve as to show substantially no elongation when stretched by hands, whereas the unoriented film was so insufficient as to easily elongate when stretched by hands. The physical properties of both the films were as shown in Table 1.

TABLE

|  | Oriented Film | | Unoriented | Testing |
|---|---|---|---|---|
|  | MD | TD | Film | Method |
| Tensile Strength (kg/cm²) | 820 | 780 | 270 | ASTM-D 882 |
| Elongation (%) | 120 | 140 | 200 | ASTM-D 882 |

Note
MD: machine direction
TD: transverse direction

A solution, which was suitable for development in aqueous systems was prepared of the following ingredients:

| | |
|---|---|
| Methyl methacrylate/methacrylic acid copolymer (weight ratio = 90/10; Mv = 80,000) | 80 g |
| Trimethylolpropane triacrylate | 20 g |
| Tetraethylene glycol diacrylate | 20 g |
| Diethylene glycol diacetate | 8 g |
| 2-Ethylanthraquinone | 5 g |
| Victoria Blue (C.I. 42563) | 0.2 g |
| Methyl Ethyl Ketone | 180 g |

The solution so prepared was coated onto a 25 μ-thick biaxially oriented polypropylene film and dried to form a photopolymerizable layer having a dry thickness of 25μ. Each of the polyvinyl alcohol films as a film support was laminated onto the photopolymerizable layer. Thus, two kinds of photosensitive elements were prepared.

Several tens of a copper-clad epoxy resin-fiber glass substrate were treated and coarsened in the same manner as in Example 1.

Figure 10:
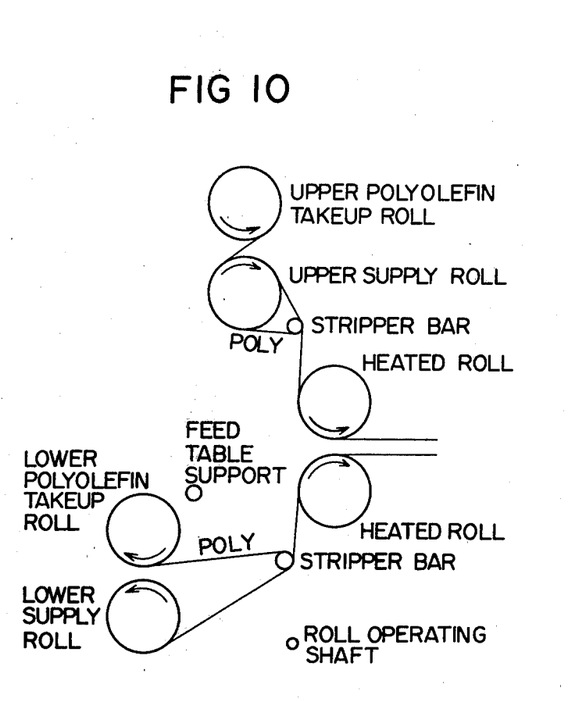
FIG. 10 is a thread-up diagram of an HRL-24 Laminater (manufactured by Du Pont Company, U.S.A.) which can advantageously be used in the step (1) of the above-mentioned method, and which was used in some of Examples and Comparative Examples that will be given later.

Each of the photopolymerizable layers with their supports (hereinafter often referred to as "resist element") was laminated from each photosensitive element onto the copper-clad epoxy resin-fiber glass substrate by using an HRL-24 Laminator (manufactured by Du Pont Company, U.S.A.) to form a laminate board. With respect to the thread-up diagram for the HRL-24 Laminator, reference is to be made to FIG. 10.

The heated rolls of the laminator were maintained at 80° C. The substrate was heated to 50° C. in a heating oven and provided for the above-mentioned lamination. The photopolymerizable layer with the oriented film as the film support was always smoothly laminated on the substrate without any troubles, when the lamination was tried several times. On the other hand, the photopolymerizable layer with the unoriented film as the film support was always laminated on the substrate with the resist element being elongated by several percents by the force generated at the time of stripping of the polyethylene terephthalate film as the protective film, when the lamination was tried several times. Thus, care must have been taken for minimizing the elongation.

In order to assess the influences of the film supports on development time, the following experiment was carried out. The exposure of each resulting laminate board was effected in the same manner as in Example 3, followed by jetting thereto of a 3% by weight aqueous solution of sodium carbonate having a temperature of 40° C. from a spray nozzle under a jetting pressure of 1.5 kg/cm² to effect development. In the case of the oriented film, the development time was 90 seconds. On the other hand, in the case of the unoriented film, the development time was 100 seconds. In view of the facts that the composition and thickness of the photopolymerizable layer was the same in both the cases and that the thickness of the support film in the case of the unoriented film was several percents smaller due to the elongation at the time of lamination than that in the case of the oriented film, the difference of 10 seconds in development time between both the cases was attributed to the orientation of polyvinyl alcohol film.

EXAMPLE 5 AND COMPARATIVE EXAMPLE 3

A 25μ-thick oriented film and a 25μ-thick unoriented film were prepared from a copolymer of methyl methacrylate/methyl acrylate (weight ratio: 85/15; M̄v: 120,000). The oriented copolymer film was prepared by melt-extruding the copolymer to form a 160μ-thick film and stretching the film so formed by 2.5 times in the longitudinal direction and by 2.5 times in the lateral direction. The preparation of a 25μ-thick unoriented copolymer film according to the melt-extrusion method was difficult because the unoriented copolymer film was brittle. Therefore, the unoriented copolymer film was prepared using a solution of the copolymer in methyl ethyl ketone according to the solvent casting method.

The unoriented film was so poor in flexibility in a practical sense that cracks appeared in the film when it was wound up on a roll.

On the other hand, the oriented film was so good in flexibility that no cracks appeared in the film when it was bent. Using this oriented film as a film support, the lamination thereof onto the same photopolymerizable layer as prepared in Example 4 and Comparative Example 2, the lamination of the photopolymerizable layer with its support onto a copper-clad epoxy resin-fiber glass substrate, and the exposure and development of the resulting laminate board were carried out in substantially the same manner as in Example 4 and Comparative Example 2 except that trichloroethylene was used in the development instead of the 3% by weight aqueous solution of sodium carbonate. During the course of these procedures, no troubles arose.

EXAMPLE 6 AND COMPARATIVE EXAMPLE 4

A 25μ-thick oriented film and a 25μ-thick unoriented film were prepared from a copolymer of methyl methacrylate/butyl acrylate/methyl acrylate (weight ratio: 80/15/5; M̄v: 180,000). The unoriented copolymer film was prepared by melt-extruding the copolymer. The oriented film was prepared by melt-extruding the copolymer to form a 230μ-thick film and stretching the film so formed by 3 times in the longitudinal direction and by 3 times in the lateral direction. Both of the films were flexible, but the oriented film was far higher in strength and far smaller in elongation than the unoriented film. The physical properties of the polystyrene films were as shown in Table 2.

TABLE 2

|  | Oriented Film | | Unoriented | Testing |
|---|---|---|---|---|
|  | MD | TD | Film | Method |
| Tensile Strength (Kg/cm²) | 730 | 680 | 360 | ASTM-D 882 |
| Elongation (%) | 28 | 35 | 74 | ASTM-D 882 |

Note
MD: machine direction
TD: transverse direction

A solution was prepared of the following ingredients:

| | |
|---|---|
| Methyl methacrylate/methacrylic acid copolymer (molar ratio = 90/10; Mv = 120,000) | 40 g |
| Trimethylolpropane triacrylate | 15 g |
| 2-Ethylanthraquinone | 0.5 g |
| Methyl Violet (C. I. 42535) | 0.1 g |
| p-Methoxyphenol | 0.15 g |
| Methyl ethyl ketone | 140 g |

The solution so prepared was coated onto a 25μ-thick biaxially oriented polyethylene terephthalate film and dried to form a photopolymerizable layer having a dry thickness of 38μ. The lamination of each of the unoriented and the oriented copolymer films as a film support onto the photopolymerizable layer, the lamination of the photopolymerizable layer with its support onto a copper-clad epoxy resin fiber glass substrate, and the exposure and development of the resulting laminate board were carried out in substantially the same manner as in Example 4 and Comparative Example 2 except that trichloroethylene was used in the development instead of the 3% by weight aqueous solution of sodium carbonate.

In the case of the oriented film, the development time was 80 seconds. On the other hand, in the case of the unoriented film, the development time was 85 seconds.

EXAMPLE 7 AND COMPARATIVE EXAMPLE 5

A 25μ-thick oriented film and a 25μ-thick unoriented film were prepared from a copolymer of vinyl chloride/vinyl acetate (weight ratio: 95/5). The unoriented film was prepared using a solution of the copolymer in tetrahydrofuran according to the solvent casting method. The oriented film was prepared by casting a solution of the copolymer in tetrahydrofuran to form a 160μ-thick film and stretching the film so formed by 2.5 times in the longitudinal direction and by 2.5 times in the lateral direction.

The oriented film was flexible and high in strength while the unoriented film was rigid and brittle. The oriented film was far less subject to scratches than the unoriented film. This will prove the advantageousness of the oriented film as a film support over the unoriented film in view of the fact that a film support having no scratches does not present a problem of light scattering at the time of exposure to actinic rays.

A solution was prepared of the following ingredients:

| | |
|---|---|
| Polymethyl methacrylate (Mv: 60,000) | 400 g |
| Trimethylolpropane triacrylate | 240 g |
| Triethylene glycol diacetate | 40 g |
| Benzophenone | 20 g |
| Michler's ketone | 2 g |
| Crystal Violet | 0.7 g |
| Methyl ethyl ketone | 1,050 g |

The solution so prepared was coated onto a 25μ-thick biaxially oriented polypropylene film and dried to form a photopolymerizable layer having a dry thickness of 25μ. Each of the unoriented and the oriented copolymer films as a film support was laminated onto the photopolymerizable layer. Thus, two kinds of photosensitive elements were prepared.

The lamination of each of the photopolymerizable layers with their supports onto a copper-clad epoxy resin-fiber glass substrate was done in substantially the same manner as in Example 4 and Comparative Example 2. In the case of the oriented film support, no troubles arose. In the case of the unoriented film support, the lamination, though possible, was somewhat difficult because the unoriented film was poor in nerve.

In order to assess the influences of the film supports on development time, time was measured until each laminate board, which was not subjected to exposure to actinic rays, was completely rid of the film support and the photopolymerizable layer by the showering development procedure with tetrahydrofuran. In the case of the oriented film, the development time was 70 seconds. On the other hand, in the case of the unoriented film, the development time was 80 seconds.

It will be apparent from the Examples and Comparative Examples that an oriented film is far higher in strength and provides a shorter time of dissolution in a developer and hence a shorter development time than an unoriented film. A higher strength allows an oriented film support to be thinner.

Using a film support each of 20μ-thick oriented films respectively prepared in substantially the same-manners as in Examples 4 to 7 except for thickness, the lamination thereof onto a corresponding photopolymerizable layer, and the lamination of the photopolymerizable layer with its support onto a copper-clad epoxy resin-fiber glass substrate were carried out in substantially the same manner as in Example 4 and Comparative Example 2. In this case, no troubles were encountered. On the other hand, in the case of 20μ-thick unoriented film supports respectively prepared in substantially the same manners as in Comparative Examples 2 to 5, the elongation and breaking of them occurred particularly in the course of lamination onto a copper-clad epoxy resin-fiber glass substrate, thus creating extreme difficulties in practical operations.

What is claimed is:

1. A photopolymerizable element comprising a layer of a photopolymerizable composition and a transparent oriented film support laminated onto one surface of the photopolymerizable composition layer which support is soluble or dispersible in a liquid developer for the photopolymerizable composition layer and capable of transmitting actinic rays and which support is of a member selected from the group consisting of methyl methacrylate homopolymer and copolymers, vinyl chloride homopolymer and copolymers, polyvinyl alcohol, and mixtures thereof.

2. A photopolymerizable element according to claim 1, which further comprises a strippable protective film provided on the other surface of the photopolymerizable composition layer.

3. A photopolymerizable element according to claim 2, wherein said protective film is of a member selected from the group consisting of polyethylene terephthalate, polyamides, polypropylene and polyethylene.

4. A photopolymerizable element according to claim 1, wherein said photopolymerizable composition comprises an organic polymer binder, an ethylenically unsaturated compound and a photopolymerization initiator.

5. A photopolymerizable element according to claim 4, wherein said organic polymer binder is a homopolymer or copolymer of methyl methacrylate and the ethylenically unsaturated compound is an acrylic polyfunctional monomer.

6. A photopolymerizable element according to claim 1, wherein said layer of the photopolymerizable composition is developable with a liquid developer consisting essentially of a member selected from the group consisting of ketones, esters, alcohols, chlorinated hydrocarbons, aromatic hydrocarbons, tetrahydrofuran, water, aqueous solutions of acid or alkali, and mixtures thereof, and said transparent oriented film support is soluble or dispersible in said liquid developer.

7. A photopolymerizable element according to claim 1, wherein the thickness of said photopolymerizable composition layer is 0.1 to 1,000μ.

8. A photopolymerizable element according to claim 7, wherein said thickness is 0.5 to 100μ.

9. A photopolymerizable element according to claim 8, wherein said thickness is 5 to 70μ.

10. A photopolymerizable element according to claim 1, wherein the thickness of said transparent oriented film support is 5 to 100μ.

11. A photopolymerizable element according to claim 10, wherein said thickness is 10 to 50μ.

12. A photopolymerizable element according to claim 11, wherein said thickness is 10 to 30μ.

13. A photopolymerizable element according to claim 1, which is in the form of a longitudinally elongated strip that is capable of being wound into a roll.

14. A photopolymerizable element according to claim 4, wherein said photopolymerizable composition constitutes a multi-layer structure in which the respective layers have successively increased concentrations of the photopolymerization initiator with increase in their distances from the film support.

15. A photopolymerizable element according to claim 4, wherein said photopolymerizable composition further includes a polymerization inhibitor and constitutes a multi-layer structure in which the respective layers have successively decreased concentrations of the polymerization inhibitor with increase in their distances from the film support.

16. A photopolymerizable element according to claim 4, wherein said photopolymerizable composition further includes a nitrogen-containing heterocyclic compound.

17. A photopolymerizable element according to claim 6, wherein said liquid developer is a member selected from the group consisting of methyl ethyl ketone, ethyl acetate, trichloroethylene, 1,1,1-trichloroethane, tetrahydrofuran, solutions of alkali and mixtures thereof.

18. A photopolymerizable element according to claim 4, wherein said photopolymerizable composition is a composition comprising polymethyl methacrylate as the organic polymer binder, trimethylolpropane triacrylate as the ethylenically unsaturated compound and a photopolymerization initiator; said transparent oriented film support is made of polymethyl methacrylate; and said liquid developer is a member selected from the group consisting of methyl ethyl ketone, ethyl acetate, trichloroethylene, 1,1,1-trichloroethane and mixtures thereof.

* * * * *